United States Patent [19]

Moore

[11] 4,454,472
[45] Jun. 12, 1984

[54] METHOD AND APPARATUS FOR DETERMINING MINORITY CARRIER DIFFUSION LENGTH IN SEMICONDUCTORS

[75] Inventor: Arnold R. Moore, Princeton, N.J.

[73] Assignee: RCA Corporation, New York, N.Y.

[21] Appl. No.: 350,250

[22] Filed: Feb. 19, 1982

[51] Int. Cl.³ .............................................. G01R 31/26
[52] U.S. Cl. ............................. 324/158 R; 324/158 D
[58] Field of Search ........... 324/158 D, 158 T, 158 R, 324/73 R

[56] References Cited

U.S. PATENT DOCUMENTS

| 4,333,051 | 6/1982 | Goodman | 324/158 R |
| 4,393,348 | 7/1983 | Goldstein et al. | 324/158 R |
| 4,433,288 | 2/1984 | Moore | 324/158 R |

Primary Examiner—Ernest F. Karlsen
Attorney, Agent, or Firm—Birgit E. Morris; Donald S. Cohen; Joseph D. Lazar

[57] ABSTRACT

Method and apparatus are provided for determining the diffusion length of minority carriers in semiconductor material, particularly amorphous silicon which has a significantly small minority carrier diffusion length using the constant magnitude surface-photovoltage (SPV) method. Steady or modulated illumination at several wavelengths provides the light excitation on the surface of the material to generate the SPV. A manually controlled or automatic servo system maintains a constant predetermined value of the SPV for each wavelength. A drop of a transparent electrolyte solution containing redox couples (preferably quinhydrone) having an oxidation-reduction potential (E) in the order of +0.6 to −1.65 volts couples the SPV to a measurement system. The drop of redox couple solution functions to create a liquid Schottky barrier at the surface of the material. Illumination light is passed through a transparent rod supported over the surface and through the drop of transparent electrolyte. The drop is held in the gap between the rod and the surface. Steady red light is also used as an optical bias to reduce deleterious space-charge effects that occur in amorphous silicon.

34 Claims, 5 Drawing Figures

METHOD AND APPARATUS FOR DETERMINING MINORITY CARRIER DIFFUSION LENGTH IN SEMICONDUCTORS

The Government of the United States of America has rights in this invention pursuant to Subcontract No. XJ-9-8254 awarded by the Department of Energy.

BACKGROUND OF THE INVENTION

This invention relates to an apparatus for determining the minority carrier diffusion length in semiconductors using the constant-magnitude surface photovoltage (SPV) method.

Apparatus and methods for determining the minority carrier diffusion length (L) using the SPV method are well known. In brief, the principle of the diffusion length (L) determination requires the illumination of a specimen surface with monochromatic radiation of energy slightly greater than the bandgap of the semiconductor. Electron-hole pairs are produced and diffuse to the illuminated (front) surface where they are separated by the electric field of the depletion region (i.e., the surface-space-charge region) to produce a surface photovoltage (SPV). A portion of the SPV signal is coupled to an amplifier for amplification and measurement. The photon intensity (photons per sq. cm. per second) is adjusted to produce the same magnitude of SPV at various wavelengths of illumination. The photon intensity required to produce this constant magnitude SPV signal is conveniently plotted on the ordinate against the reciprocal of the absorption coefficient on the abscissa for each wavelength. The resultant plot is linear and is extrapolated to the zero intensity intercept on the negative abscissa. This intercept value is the effective diffusion length (L). For a more detailed description of the theory and background for this method, see an article "A Method for the Measurement of Short Minority Carrier Diffusion Lengths in Semiconductors," by A. M. Goodman in the *Journal of Applied Physics*, Vol. 32, No. 12, pp. 2550–2552, December 1961. The American Society for Testing and Materials has adopted a standard using this method which is published as ASTM F 291-78. The ASTM standard, when implemented according to the block diagram of FIG. 1 of ASTM F 291-78, is provided particularly for testing the diffusion length (L) for minority carriers in silicon but the method in general may be used for other semiconductor materials.

See U.S. patent application, entitled "METHOD AND APPARATUS FOR DETERMINING MINORITY CARRIER DIFFUSION LENGTH IN SEMICONDUCTORS", Ser. No. 153,920, now U.S. Pat. No. 4,333,051, filed on May 28, 1980 by A. M. Goodman for a description of an apparatus using this principle in which a servo system maintains a constant predetermined value of the SPV thereby allowing the measurements to be carried out in a relatively short time. This minimizes the effects of drift caused by laterally diffusing minority carriers during a test. This Goodman application describes a capacitance-pickup electrode which is placed to make physical contact with the surface of a semiconductor material to sense SPV test signals. The Goodman method however is not suitable for measuring the significantly small diffusion length of amorphous silicon which is known to exhibit very slow transients in SPV generated by chopped or modulated light.

See U.S. patent application, entitled "METHOD AND APPARATUS FOR DETERMINING MINORITY CARRIER DIFFUSION LENGTH IN SEMICONDUCTORS," Ser. No. 228,575, now U.S. Pat. No. 4,393,051, filed on Jan. 26, 1981 by B. Goldstein et al. for a description of an apparatus by which the SPV is measured by a Kelvin method-type probe.

In my copending U.S. patent application, entitled "METHOD AND APPARATUS FOR DETERMINING MINORITY CARRIER DIFFUSION LENGTH IN SEMICONDUCTORS," Ser. No. 280,918, now U.S. Pat. No. 4,443,288, filed July 6, 1981, I describe a means for determining the minority carrier diffusion length using a redox solution supported in an open-ended cell placed on the surface of a semiconductor material. That apparatus is difficult to move over the surface since the redox liquid must be removed and replaced for each measurement at a different location. Moreover, since the cell carrying the redox solution is relatively deep, correction is needed for the effect of the colored redox solution on the measurements.

There is a need for a means to determine the SPV in semiconductors by a direct connection to the surface of material using steady or very low frequency varying light using a redox solution that is easily moved over the surface and requires no correction for the color effect of the solution.

SUMMARY OF THE INVENTION

According to the present invention, the diffusion length (L) of minority carriers of semiconductor material, for example, amorphous silicon, is determined by illuminating the surface with a steady or nearly steady light and measuring the surface photovoltage (SPV) with a contact coupled to the surface through a transparent drop of a redox (reduction-oxidation) solution establishing a liquid Schottky barrier at the surface of the material.

DETAILED DESCRIPTION OF THE PREFERRED EMBODIMENTS

Figure 2:
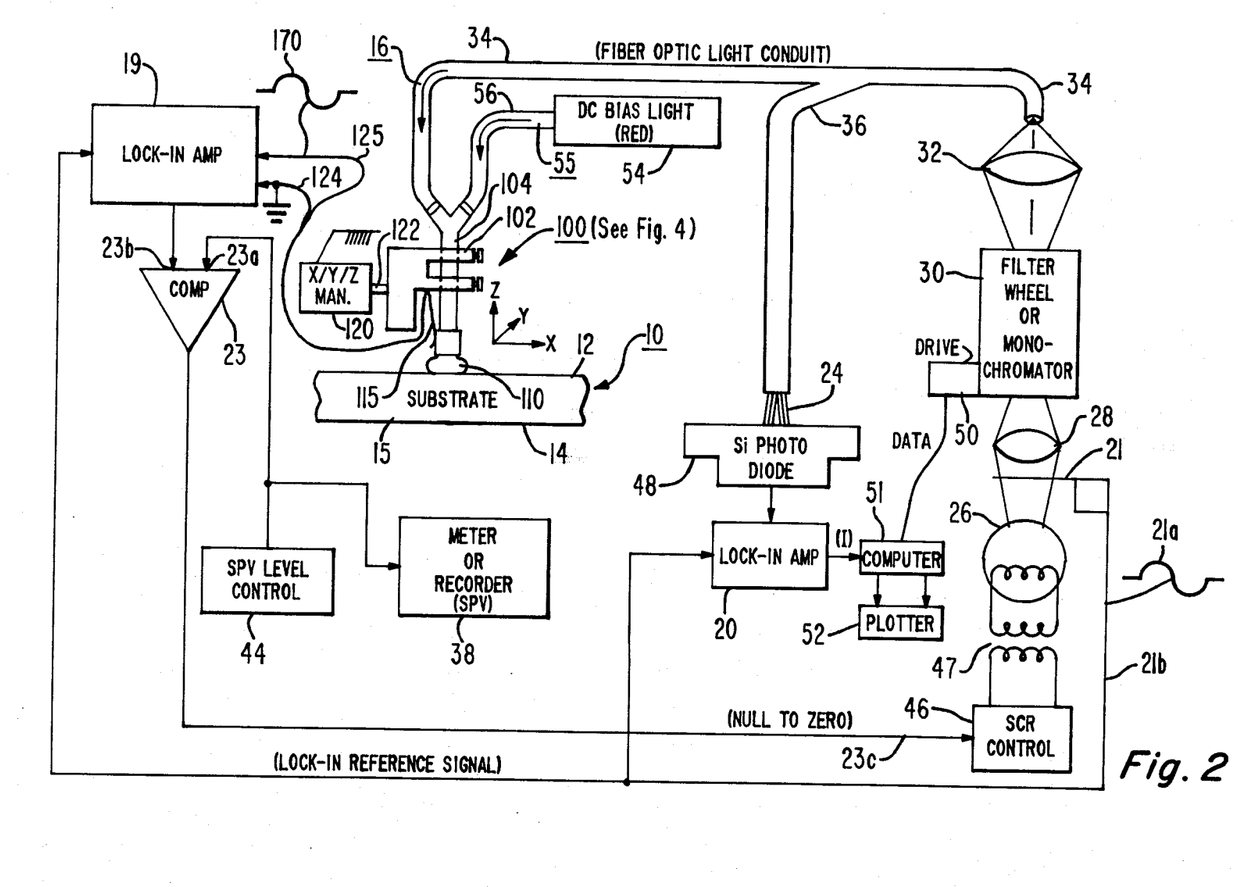
FIG. 2 is a block schematic of the preferred form of apparatus useful in practicing the invention.

The measuring apparatus of the invention as illustrated in FIG. 2, to be described, provides a means using a modified version of the constant-magnitude surface photovoltage (SPV) method for determining the minority carrier diffusion length (L) in a semiconductor formed of the type that will be defined. In the embodiment to be described, the wafer for which the diffusion length is to be measured is a layer of hydrogenated amorphous silicon (a-Si:H). Nevertheless, the invention can be used to determine the diffusion length of minority carriers in semiconductor materials other than those in which the diffusion length is significantly small, provided the thickness of the semiconductor material wafer being tested is at least greater than the diffusion length of the minority carrier and preferably four times that diffusion length. Such semiconductor material includes, but is not necessarily limited to, silicon, germanium, gallium arsenide, indium phosphide as well as amorphous semiconductor material.

Figure 1:
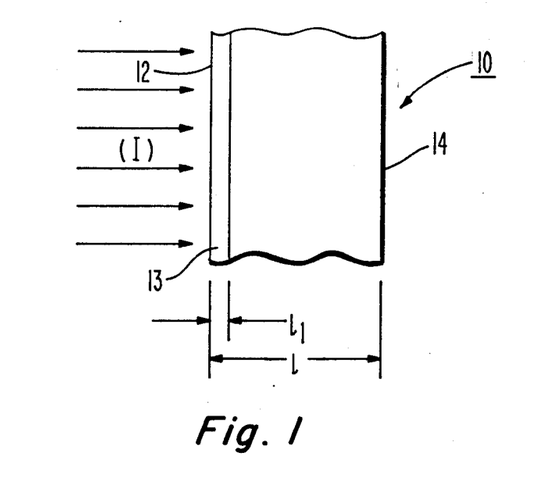
FIG. 1 is a schematic illustrating the geometric parameters of a semiconductor specimen useful in understanding and practicing the invention.

The geometry of a specimen wafer 10 is illustrated in FIG. 1. Wafer 10 is assumed to be in the form of a semiconductor slab or substrate 15 having a thickness l formed in the embodiments to be described of hydrogenated amorphous silicon. One surface 12 is uniformly illuminated by monochromatic light from a source of photon energy hν, slightly greater than the band gap ($E_G$) of the semiconductor material, while the opposite surface 14 is kept dark. The quantum flux of the light is represented by I in relative units. Electron hole pairs are produced by the absorbed photons. Some of these pairs diffuse to the illuminated surface 12 where they are separated by the electric field of the depletion or surface-space-charge region 13 within a thin layer of amorphous silicon (a-Si) having a thickness $l_1$, producing a surface photovoltage (SPV).

Figure 3:
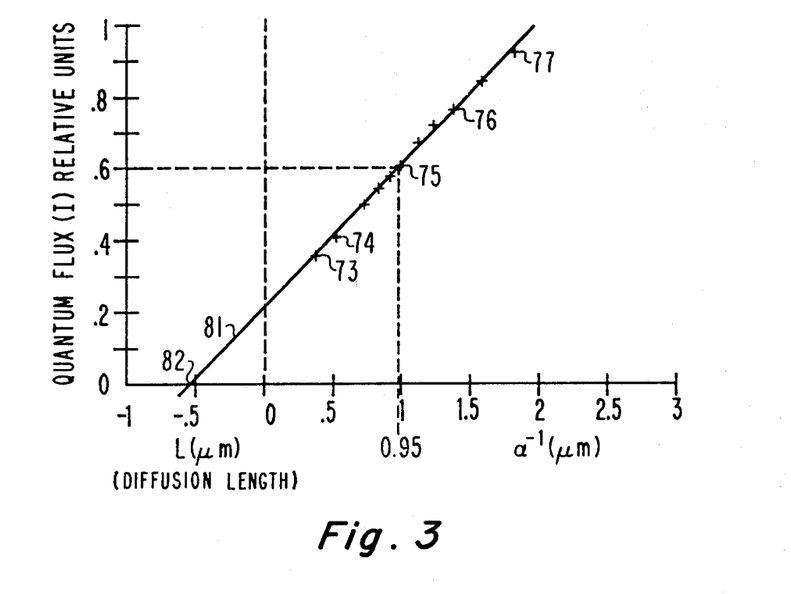
FIG. 3 is a plot of the quantum flux I versus the reciprocal of the absorption coefficient.

The apparatus for carrying out the measurements necessary to determine the diffusion length (L) according to the present invention is shown in FIG. 2. The apparatus provides a means to measure the surface photovoltage of the semiconductor. As described in detail in the aforementioned Goodman et al. application, the surface photovoltage (i.e., SPV) developed at the illuminated surface 12 of the amorphous silicon film of the wafer 10 is a function of the excess minority carrier density injected into the surface space charge region 13 (as shown and described above for FIG. 1). The density is in turn dependent upon the incident light intensity (photon flux) I, the optical absorption coefficient and the diffusion length L. The diffusion length may be measured by determining the variation of I with reciprocal of the absorption coefficient α with wavelength λ at a constant value of (SPV). An accurate knowledge of α as a function of wavelength λ is thus required. An example of a graph that is used to plot several measurements of the SPV at various wavelengths is illustrated in FIG. 3 to be described further hereinafter. The thickness of the material l as illustrated in FIG. 1 must be greater than the diffusion length L. In practice, a material thickness (l) of at least four times the diffusion length (L) is preferred although the invention provides practical measurements for material of thicknesses between two and four times L.

The optical subsystem of the apparatus of the invention is formed of a light source 26 for providing a spectrum of light that will include at least the desired wavelengths that are to be used for the determination of the diffusion length (L) by measuring the intensity of illumination incident upon the sample, for example, wafer 10. The measured intensity of illumination is used to determine the diffusion length (L) by the known relationship of the reciprocal of the absorption coefficient ($\alpha^{-1}$) as shown in the illustrative plot shown in FIG. 3.

The light source of lamp 26 provides a beam of white light which, in this embodiment, is periodically interrupted by a light chopper 21 at one frequency, typically within the range of as low as 1 Hz and as high as 1,000 Hz but typically no higher than 10 Hz, and applied to a filter wheel or monochromator 30 through a first lens 28. The monochromator 26 is provided with suitable means for changing the wavelength to any one of a preselected set of wavelengths as by a wavelength drive 50. The wavelength drive 50 has means to rotate diffraction gratings and the like provided in such filter wheels or monochromators in incremental steps to change the wavelength.

The chopped beam from the monochromator 30 is passed through a focusing lens 32 which is arranged to pass the light as a light beam 16 through a preferably flexible fiber optic light conduit 34 to carry the light to the sample surface 12 through an illuminator and SPV sensor device 100 (shown in detail in FIG. 4, to be described) and a light transparent and conductive drop 110 of an oxidation reduction solution 112 (commonly called a "redox" solution), also to be described in greater detail hereinafter.

Figure 4:
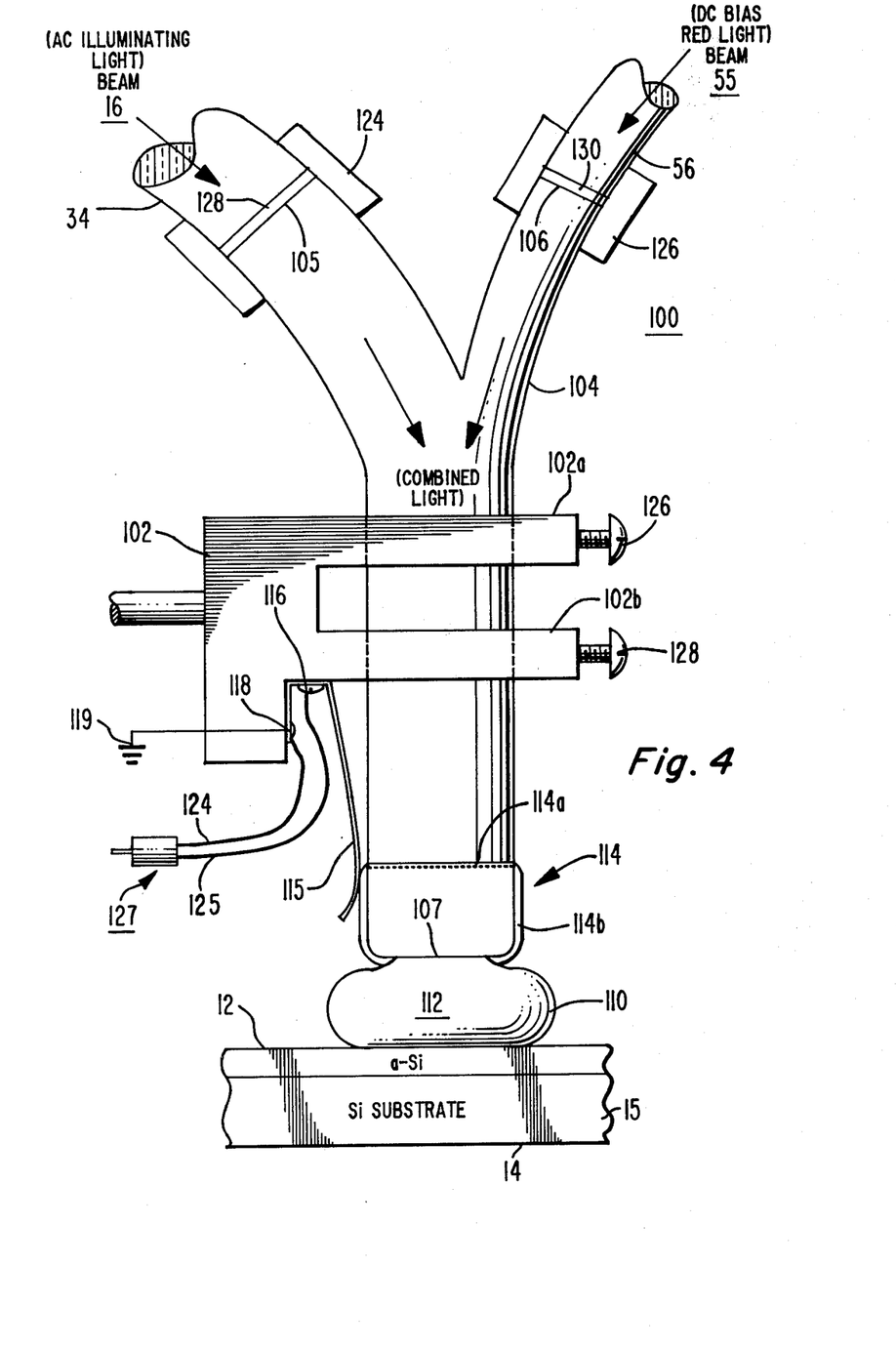
FIG. 4 is an enlarged schematic of the illumination and SPV sensor device (100) shown in FIG. 2.

Reference is now made to FIG. 4 which shows in enlarged detail the illuminator and SPV sensor device 100 of FIG. 2. Device 100 comprises a rod 104, preferably round in cross-section of glass or fused quartz, such as Pyrex, having bifurcated ends 105 and 106 and end 107. The diameter of rod 104, in one embodiment, is 6 mm. The rod 104 is supported by a bracket 102, made of an insulating plastic such as Bakelite, having extension members 102a and 102b with circular holes to receive the rod 104. Screws 126 and 128 are used to hold the rod 104 in place. Bracket 102 is attached to a 3-axis manipulator 120 by a connecting member 122. Manipulator 120, of known form, such as one available from the Line Tool Company of Allentown, Pennsylvania, provides selectable 3-axis movement for device 100. Thus, device 100 can be moved over the surface 12 from one surface portion to another as well as vertical movements thereover. Vertical movements provide a means to deform the drop 110 to a desired vertical thickness. The transparency and conductivity are affected by the vertical thickness of the drop 110. End 107 is optically polished so that light will be efficiently passed to transparent drop 110 which in turn passes light to surface 12. The ends 105 and 106 are respectively connected by connectors 124 and 126 to the fiber optic light conduit 34 and a fiber optic conduit 56 carrying a red light beam 55 from a red d.c. beam light source 54. Index-matching pastes 128 and 130 are provided between the respective end faces of the fiber conduits 34 and 56 and 105 and 106 to improved passage of the light beams 16 and 55 carried by the respective conduits.

Means 114 provides an electrical signal representative of the SPV generated at the surface 12 responsive to light beam 116 illuminating surface 12. Means 114 comprises an electrical conductor 114a formed into at least one turn around the surface of the rod 104 at about 6–10 mm up from end surface 107. The surface of rod 104 is then covered in the form of a ring or an open-ended cap 114b over the conductor 114a with a suitable conductive paint, such as a baked platinum paint, sold by the Hanovia Company under the trade name "Liquid Bright Platinum." The cap 114b as seen in FIG. 4 extends over the bottom edge of rod 104, preferably rounded, to provide a good conductive contact with the surface of the drop 110 positioned under the surface 107 of rod 104. Note that the extended rounded corner of the cap 114b also serves to provide a recess to hold drop 110 of the redox solution 112. A strain-relief conductor 115 such as a resilient strip of copper is pressed against cap 114b and connected to a terminal 116 mounted on support 102. A terminal 118 also mounted on support 102 is connected to the system electrical ground 119. Two conductors 124 and 125, suitably provided by a shielded coaxial cable 127, are connected to a lock-in amplifier 19 (shown in FIG. 2), to provide the SPV signal 170 to the apparatus as will be further explained.

Drop 110 is deposited on the surface 12 by the use of a suitable medicinal or eye dropper (not shown). The inside diameter of the eye dropper is preferably smaller than the diameter of the drop 110. Thus, for a drop 110 having a diameter slightly larger than the rod 104, e.g. 6 mm, the eye dropper will have an opening of about 1-2 mm. The drop 110 of redox solution 112 is deposited on the surface 12 either under the end 107 or at some other location after which the end 107 is positioned over the drop 110. Manipulator 120 (FIG. 2) is adjusted to deform the drop 110 into generally an oblate spheroid as shown enlarged in FIG. 4. A typical dimension between rod surface 107 and semiconductor surface 12 is in the range of 0.5 to 1.0 mm. The surface tension of the solution 112 is high enough to maintain the drop 110 in the deformed shape. The surface 12 contacting the drop 110 is relatively unwetted by redox solution 112 while the polished end 107 is wetted by the solution 112 to thereby provide adhesion between the rod and drop 110. Unwetted surface 12 thus provides a relatively slippery surface allowing the drop 110 to be easily moved by a sliding action over the surface 12 effected by operating manipulator 120 in desired lateral movements. Note the shape of drop 110 is caused by the vertical force of rod 104 and the relative degrees of wetting effected by the redox solution 112 on the surfaces 107 and 112. The cap 114b, it is noted, provides good electrical contact with the surface of the conductive drop 110. Electrical signals are thus conducted from the surface 12 via the liquid Schottky barrier formed by the drop 110 in contact with surface 12 to cap 114b, thence to conductor 114b to conductor 115, to conductor 125 and then to amplifier 19. Moreover, light passing from rod 104 into drop 110 illuminates the surface 12 to develop the SPV.

Reference is now made back to FIG. 2. Amplifier 19 must have a high impedance input greater than one megohm, suitably 10 megohms, in order to minimize current flow through the redox solution 112 in drop 110. It should be understood that excessive current flow through the redox solution may cause chemical dissolution or oxide formation of the semiconductor material of surface space-charge region 13. Lock-in amplifier 19 in this embodiment serves to amplify the a.c. signal 170 derived from the electrode 114 and apply it to input 23b of comparator 23. The other input 23a of the comparator 23 is a reference voltage representing the predetermined surface photovoltage level at which the illumination intensity (I) is to be maintained constant in order to make the determination of the diffusion length L. The lock-in amplifier 19 is synchronized to the reference frequency of the chopped light if chopped light is used. This reference signal at the frequency of the chopper represented by waveform 21a is carried from the chopper 21 via bus 21b to the input to the lock-in amplifier 19. As will be explained, the amplifier 19 may be a d.c. amplifier when the system uses continuous, uninterrupted light from source 26, for which a reference signal is not required.

For convenience, a meter 38 is connected to the output of the SPV level control 44 as a reference of the voltage desired to maintain the SPV constant. The output of comparator 23 is coupled to silicon controlled rectifier (SCR) control 46. SCR control 46 maintains the voltage at a transformer 47 to a constant value when the input on path 23b is zero. The lamp 26 is energized via the transformer 47 at thus a predetermined voltage. The comparator 23, when the input from control 44 and the lock-in amplifier 19 are equal, provides the zero voltage 23a to control the SCR control 46.

Chopper 21 is operated to interrupt the light 26 at a rate of about preferably 1-5 cycles/second for use with amorphous silicon (a-Si). In a continuous (i.e. d.c.) light mode, the chopper is not operated; it is just positioned to allow the light to pass from the lamp 26 to the filter wheel 30 via the lens 28.

The SCR control 46 is suitably adjusted to a desired reference level with means not shown to bring the illumination intensity (I) into the range of intensity within which the SPV may be set by the level control 44 and the comparator 23 at each selected wavelength of light illuminating the surface.

The light intensity (I) of the beam 16 is measured by sampling the beam via light conduit 36. The light illuminates a silicon (Si) photodiode 48 which detects the light and provides a signal representing the quantum flux I. The detected light signal is applied to a lock-in amplifier which in turn and responsive to the lock-in reference signal 21a from chopper 21 provides an input to computer 51 to plot the data for determining the diffusion length L (shown in FIG. 3 to be described).

The redox couple solution 112 in drop 110 is an oxidation reduction solution in an electrolyte that has been discovered to form a liquid Schottky barrier at the surface of a semiconductor material in which it is in contact. This phenomenon is described in an article entitled "Schottky Barriers at the Interface Between Amorphous Silicon and Electrolytes" by Richard Williams, *J. Applied Physics*, 50 (April 4, 1979), pp. 2848-2851. I have in the performance of the measuring technique of the present invention used several of the redox solutions identified in the Williams paper. In addition, I have found that a solution of hydroquinone/quinone, commonly known as quinhydrone, a solution also used in pH testing, provides a good result. The various solutions that I have tried are tabulated below.

TABLE 1

| Ion Concentrations of Redox Couple (mol/L) | E (Volt) | Other Components of Solution (mol/L) |
|---|---|---|
| Stannous/Stannic $Sn^{+2}$ (0.1)/$Sn^{+4}$ (0.01) | −0.15 | $H_2SO_4$ (0.75) |
| Ferrocyanide/Ferricyanide $Fe(CN)_6^{-4}$ (0.1)/$Fe(CN)_6^{-3}$ (0.1) | −0.36 | $H_2SO_4$ (0.5) |
| Ferrous/Ferric $Fe^{+2}$ (0.05)/$Fe^{+3}$ (0.05) | −0.77 | $H_2SO_4$ (0.75) |
| Cerrous/Cerric $Ce^{+3}$ (0.05)/$Ce^{+4}$ (0.05) | −1.61 | $H_2SO_4$ (0.75) |
| Hydroquinone/Quinone $C_6H_4(OH)_2/C_6H_4O_2$ (equimolar) | −.70 (See Note) | Standard Buffered pH6 Solution |

Note:
for the quinhydrone couple the electrode potential (E) is a function of the pH of the solution according to the well-known relation $E = -0.70 + (0.059)$ (pH). In the solution of table I where pH is 6, $E = -0.35$.

While there are many known redox couples, I have not examined all of them for use in the present invention. From the experience of the solutions used so far it seems that the range of electrode potentials (E) of useful redox couples are in the order of +0.1 to −1.65 volts for use with undoped or slightly doped n-type material. For p-type, a-Si redox solution of electrode potentials of +0.6 volt to +0.1 appear to be suitable. Moreover, it is essential that both of the components of the redox couple be soluble, be stable and be nonreactive to the material of the semiconductor surface. Furthermore, the redox solution should be relatively easy to use in the sense that it has no gaseous or solid products.

I have discovered that these redox solutions provide sufficient surface tension to maintain a drop 110 of the solution 112 under the rod 104 for the dimensions described. Experimentation is needed to determine the maximum diameter of a drop 110 that can be maintained in operative position, subject to photon flux measurement error introduced by the colored redox solution as will be explained.

In general, the redox solution is selected to meet the criteria just outlined. Thus, an acid redox solution in the range of $+0.1$ to $-1.65$ (depending also on whether the semiconductor is p-type or n-type) appears to be useful in practicing the invention. The basic redox solutions would appear to form oxides. Nevertheless, I have not tried a basic redox solution in practicing this invention. See W. M. Latimer's text on *Oxidation Potentials*, Prentice Hall, 1952, table 84, pp. 340–345, for a comprehensive list of available redox solutions. Solutions in that table not useful for this invention will be apparent to those skilled in the art in view of the criteria just described.

While the liquid Schottky barrier that is provided by this redox solution 112 is very effective in coupling the SPV from the surface 12 to the measuring circuit via the electrode 114, as well as providing a system that is substantially noise free, down even to a few hundred microvolts of signal, the problem in measuring very accurately the diffusion length L is that the known redox liquids are usually colored. Such a colored liquid would introduce an error in the photon flux measurement if the drop 110 of redox solution 112 were as much as 3–5 mm thick. This problem is reduced if not overcome by keeping the dimension of drop 110 in the gap between rod 104 and surface 12 quite small, i.e. about 0.5 to 1.0 mm as described above.

If the diffusion length L is sufficiently small, as in a-Si, so that it is no longer large compared to the space charge region 13 in semiconductor material 10, the accuracy of the measurement may be impaired. I have discovered that such operating conditions can be overcome by providing a d.c. bias light beam 55 from source 54 in parallel with the illuminating light 16 from source 26. This is achieved by preferably a red d.c. bias light beam 55 coupled by means of a light conduit 56 to provide a red light beam 55 that is known to penetrate through the space charge region 13. The red light beam 55 is combined with the illumination light beam 16 in the rod 104 (see FIG. 4). I have discovered that the red bias light 55 provides a means to suppress the space charge region effects mentioned above. Accordingly, accuracy in the determination of the diffusion length L is achieved.

For each exposure of the material of the semiconductor 10 to light at a different wavelength, a wavelength drive 50 is provided to operate a filter wheel or monochromator 30 to a selected wavelength. For a-Si, the light is varied within a range of 4000 to 7000 angstroms. The wavelength drive 50 provides also an input signal to a computer 51 which responds also to the output of lock-in amplifier 20 providing an intensity illumination signal (I). The data signals of the illumination intensity (I) and wavelength are calculated by the computer 51 to provide control signals to operate a plotter 52 to plot the various measurements as along a plot as indicated in FIG. 3.

In the practice of the invention it should be understood that the intensity of light source 26 should be sufficient to develop a light beam 16 that will develop an appreciable SPV on the surface 12 and yet not be so great as to saturate the bending of the energy bands. For amorphous silicon, band bending saturation occurs for SPV values at about 300 millivolts.

Suitable calibration of the flux reading (I) generated by the lock-in amplifier 20 is needed to compensate for the wavelength dependent response of the detector photodiode 48 for each different wavelength of light source 26 used for the measurements. In practicing the present invention in the laboratory, the wavelength compensation is done by calculation. In practical applications the computer calculates the value needed.

As explained in greater detail in the above-identified patent application of A. M. Goodman, the value of the surface photovoltage (SPV) is used to determine the diffusion length L at a given wavelength of light.

The magnitude of the SPV depends on both the optical absorption coefficient $\alpha$ ($cm^{-1}$) and the photon flux I (photons $-cm^{-2}-sec^{-1}$). A series of different wavelength ($\lambda$) values is selected to give different values of the absorption coefficient. At each value of the wavelength $\lambda$, the flux I is adjusted to give the same value of the SPV, that is, a constant magnitude of the SPV. If I is plotted against the reciprocal of the absorption coefficient ($\alpha^{-1}$) for each of these constant magnitude SPV points, the result is a linear graph whose extrapolated intercept on the negative reciprocal absorption coefficient axis is the effective diffusion length (L). An example of such a graph is illustrated in FIG. 3 to be described further hereinafter. The thickness 1 of the material 10 must be much greater than the diffusion length L. In practice, a material thickness (l) of at least four times the diffusion length (L) is preferred although the invention provides practical measurements for material of thicknesses between two and four times L.

In the operation of the apparatus illustrated in FIG. 2, light from source 26 at a first predetermined wavelength as set by the $\lambda$ drive 50 illuminates by beam 16 surface 12 via light conduit 34, rod 104 and drop 110. The chopper 21 is operated for example at a frequency of three cycles per second. The light is thereby chopped to provide an alternating signal 170 derived from the SPV developed by the illuminating beam 16, via the liquid Schottky barrier manifested by the redox solution 112 in drop 110. The SPV signal appears at terminal 116 via conductor 115 and terminal 114. The signal 170 is coupled by conductor 125 to the lock-in amplifier 19 which is synchronized by the chopper frequency signal 21a on path 21b. The amplified signal from amplifier 19 is coupled to comparator 23 to compare that signal to the signal from SPV level control 44 which is adjusted to a predetermined SPV value as indicated on meter 38. The signal to comparator 23 via input 23b is a d.c. signal representing the RMS value of the SPV. When that value is equal to the predetermined value of path 44a the output from comparator 23 is zero. The signal on path 23c adjusts the SCR control 46 to maintain the predetermined, preset value.

A series of tests at different wavelength of light source 26 are performed in a similar manner. Thus, a second wavelength is selected for light source 26 via the monochromator 30 to illuminate the surface 12. The circuit operates in a similar manner to provide a reading on meter 38 indicative of the SPV. The light intensity of the light beam 24, carried in conduit 36, is measured by the photodiode 48. The signal from the diode 48 after amplification by amplifier 20 provides an output signal I representing the illumination intensity or quantum flux. Accordingly, for the series of tests to meet the requirement of a constant SPV, the intensity of the light source 26 for each wavelength is automatically adjusted so that the SPV value of the first measurement at the first selected wavelength is the same for all tests.

A series of such illumination steps at different wavelengths are repeated to provide a fair number of sample points of the type indicated by points 73, 74, 75, 76, and 77 illustrated in FIG. 3. Each sample point is referenced to FIG. 3 by the quantum flux (I) in relative units needed to develop the constant SPV value. This flux value is determined by amplifier 20 providing a signal representing the sampled light detected by photodetector 48.

For each point to be plotted as illustrated by FIG. 3, the absorption coefficient $\alpha$ is determined from the respective wavelengths of light used for each test point. These points are then plotted as shown in FIG. 3. For example, for point 75 for a quantum flux I of 0.6, the reciprocal of the absorption coefficient for the wavelength of the light is approximately 0.95 cm as shown plotted in dotted lines. A plurality of such test points are plotted and a line 81 is drawn as indicated to extend into the negative axis which, as known, and explained above represents the diffusion length L in micrometers. In the example illustrated, the intersection point 82 indicates a diffusion length L equal to 0.55 micrometers for a specimen of amorphous silicon.

The results of the measurement of the diffusion length (L) according to this invention are essentially the same as measurements made in accordance with the method and apparatus described in my above-identified copending application Ser. No. 280,918. One of the advantages of using the present invention is the ability to move the redox solution drop 110 easily over the measurement surface.

If it is desired to determine the length L at different locations over the surface 12, the drop 110 is moved to the desired location by use of manipulator 120. The surface 12 is then illuminated by light from source 26 and measurements repeated as explained above.

In practice, the invention may be used in the fabrication or manufacture of solar cell wafers. Accordingly, in such uses the redox solution drop 110 can be housed in the same chamber as the processing apparatus. Moreover, the invention can be used to couple the SPV voltage for using a steady source of light. For such use the chopper 21 will be rendered inoperative to allow a steady illumination. Accordingly, the lock-in amplifiers 19 and 20 will be d.c. amplifiers. Otherwise, the system will operate in the same manner as described hereinabove.

Figure 5:
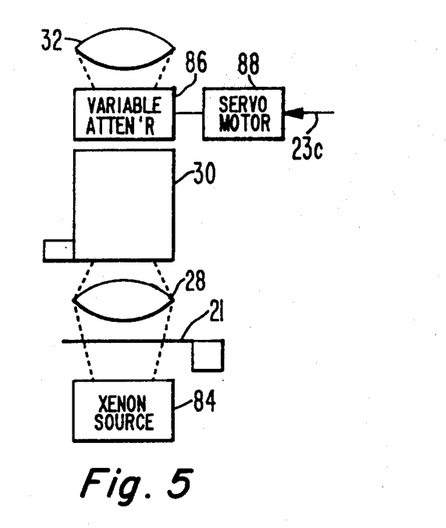
FIG. 5 is a modification of the apparatus of FIG. 2 illustrating another embodiment of the invention.

Instead of controlling the intensity of the light beams 16 and 24 by the control of the intensity of incandescent lamp 26, the same effect can be achieved with a constant intensity lamp by inserting a variable transmission light attenuator 86 into the light path between monochromator 30 and lens 32 as shown in FIG. 5. This attenuator is driven by a servo motor 88 operating in response to an error signal from the comparator via path 23c. This arrangement allows the use of a more powerful xenon lamp 84 even though such lamps are not well adapted to direct electrical control of their intensity. The operation of the system of FIG. 5 is otherwise the same as described above for FIG. 2. The use of the xenon light source 84 produces higher light intensity resulting in a better signal-to-noise ratio thereby allowing for more sensitive SPV measurements.

It will now be appreciated that the invention provides an apparatus and method for determining the diffusion length L of minority carriers in semiconductor material having significantly small diffusion lengths. Such material is typically amorphous silicon including hydrogenated amorphous silicon of the type used in the fabrication of solar photovoltaic devices. The use of an electrolyte solution which develops a liquid Schottky barrier at the surface of the material according to the invention allows for essentially a direct current coupling of the SPV from the material to external circuitry for measurement. The illuminating light can be steady or chopped, the only limitation of the illumination characteristic being the time response characteristics of the material to light.

While there is physical contact made to the surface of the material only by the solution 112 in drop 110 the proper selection of the solution makes the procedure substantially non-destructive.

It should now be appreciated and understood that the Schottky barrier developed by the redox couple solution 112 in drop 110 acts precisely like a surface photovoltage generator as understood in the prior art. The discussion of the prior art phenomenon is described in the above-identified A. M. Goodman patent application.

The liquid Schottky barrier in drop 110 according to this invention operates to quite low chopping rates in the order of 1-5 cycles/second. Moreover, the liquid Schottky barrier allows for steady light illumination whereby the system operates in essentially a direct current mode. Accordingly, since no capacitive coupling is required as has heretofore been required in certain prior art systems, the coupling of the SPV to the electronic amplifiers is entirely conductive. Furthermore, the output signals derived from the electrode 114 contacting the liquid solution 112 in drop 110 are relatively large for a given amount of light illumination provided the oxidation reduction potential of the selected redox coupling solution in the drop 110 results in a high Schottky barrier height and high open circuit voltage both on the order of 300 millivolts. The bifurcated light conduit 104 enables both the chopped light beam 16 and the red light beam 55 to be combined in a single light conduit. Because of the close spacing of the end 106 of the pipe 104 to the surface 112 via the drop 110 the light transfer efficiency is quite good. Moreover, since the thickness of the drop 110 is quite small no compensation in the color effect of redox solution 112 is needed.

Various modifications can be made to the embodiments described as will be apparent to those skilled in the art. Thus, the measurement and control means can be utilized with open or closed loop servos of the type disclosed in the respective aforementioned patent applications of A. M. Goodman, B. Goldstein et al. and myself.

While the invention is advantageously useful in determining the diffusion length of the minority carriers of amorphous silicon because such lengths are so small and, moreover, because the response time is so large, the invention is useful in general for determining the minority carrier length of any semiconductor material regardless of the magnitude of the diffusion length or the response time. The choice of whether to use the so-called chopped light technique described in the aforementioned patent application of A. M. Goodman, the technique disclosed in the Goldstein et. al. application (which may be termed the d.c. light technique) or the technique according to my earlier application, Ser. No. 280,918, or my present invention disclosed hereinabove (both of which may be termed the "direct connection" technique) depends on the conditions under which the tests are to be made.

What is claimed is:

1. A method for determining the minority carrier diffusion length of a sample of semiconductor material, the sample having two major surfaces, one of the surfaces arranged for illumination and the other surface shielded from illumination including the steps of:
(a) providing on a portion of the one major surface of the sample a substantially transparent drop of an electrolyte solution having sufficient surface tension to sustain said drop on said surface and containing redox couples, said electrolyte solution being soluble, stable and non-reactive to the semiconductor material and free of solid or gaseous products and having a redox potential to form a liquid Schottky barrier at the surface of the sample;
(b) holding said drop on said surface portion beneath a body of transparent material;
(c) substantially illuminating said portion of the one major surface of the sample with monochromatic light that is of a selected wavelength by passing said light through said transparent conducting surface and said drop of redox couple solution to provide at said conducting surface an electrical signal representing the surface photovoltage (SPV) on the sample generated in response to said light;
(d) controlling the SPV electrical signal to a predetermined value; and
(e) providing a first electrical signal representing the illuminating intensity (I) incident upon the sample, and a second electrical signal representing the wavelength of the light.

2. The method of claim 1 wherein said redox couple has a redox (oxidation-reduction) potential in the range of 0.6 to $-1.65$ volts.

3. The method of claim 2 wherein said material is amorphous silicon and the light is at a wavelength within the range of 4,000 to 7,000 angstroms.

4. The method of claim 3 wherein the redox couple solution comprises a stannous/stannic ($Sn^{+2}/Sn^{+4}$) couple in an acid solution in which the standard electrode potential E is $-0.15$ volts.

5. The method of claim 3 wherein the redox couple solution comprises a ferrocyanide/ferricyanide $[Fe(CN)_6^{-3}/Fe(CN)_6^{-4}]$ couple in an acid solution in which the standard electrode potential (E) is $-0.36$ volts.

6. The method of claim 3 wherein the redox couple solution comprises a ferrous/ferric ($Fe^{+2}/Fe^{+3}$) couple in an acid solution in which the standard electrode potential (E) is $-0.77$ volts.

7. The method of claim 3 wherein the redox couple solution comprises a cerrous/cerric ($Ce^{+3}/Ce^{+4}$) couple in an acid solution in which the electrical potential (E) is $-1.61$ volts.

8. The method of claim 3 wherein the redox couple solution comprises a hydroquinone/quinone couple $[C_6H_4(OH)_2/C_6H_4O_2]$ in standard buffered solution in which the electrical potential (E) is about $-0.7+0.059\times pH$.

9. The method of claim 1 further comprising the step of:
moving said drop over said material surface from one portion thereof to another.

10. The method of claim 1 further comprising the step of:
varying a vertical force on said drop to deform the drop to a selected vertical thickness to thereby alter the effective transparency and conductivity of the drop.

11. The method of claim 1 further comprising the step of illuminating said one major surface with steady red light to suppress space charge effects in said sample.

12. The method of claim 1 comprising the step of automatically plotting a curve of illuminating intensity (I) versus the reciprocal absorption coefficient ($\alpha$) as a function of wavelength ($\lambda$) for a plurality of wavelengths of light.

13. The method of claim 1 comprising illuminating the sample with steady monochromatic light.

14. The method of claim 1 comprising illuminating the sample with chopped monochromatic light.

15. Apparatus for determining the minority carrier diffusion length of a sample of semiconductor material, the sample having two major surfaces, one of the surfaces arranged for illumination and the other surface shielded from illumination comprising:
(a) on a portion of the one major surface, a substantially transparent drop of an electrolyte solution having sufficient surface tension to sustain said drop on said surface and containing redox couples, said electrolyte solution being soluble, stable and non-reactive to the semiconductor material and free of solid or gaseous products;
(b) a body of transparent material having a conductive transparent surface portion supported over said material surface portion and means to hold said drop of redox solution on said material surface portion;
(c) means for illuminating said portion of the one major surface of the sample with monochromatic light that is of a selected wavelength by passing said light through said body, said transparent surface and said drop of redox couple solution to provide an electrical signal representing the surface photovoltage (SPV) on the sample generated in response to said light;
(d) means for controlling the SPV electrical signal to a predetermined value; and
(e) means for providing a first electrical signal representing the illuminating intensity (I) incident upon the sample, and a second electrical signal representing the wavelength of the light.

16. The apparatus according to claim 15 wherein said redox couple has a redox (oxidation-reduction) potential in the range of 0.6 to $-1.65$ volts.

17. The apparatus according to claim 16 wherein said semiconductor material is amorphous silicon and wherein said light has a wavelength within the range of 4000 to 7000 angstroms.

18. The apparatus according to claim 16 wherein the redox couple solution comprises a stannous/stannic ($Sn^{+2}/Sn^{+4}$) couple in an acid solution in which the electrical potential (E) is $-0.15$ volts.

19. The apparatus according to claim 16 wherein the redox couple solution comprises a ferrocyanide/ferricyanide $[Fe(CN)_6^{-4}Fe(CN)_6^{-3}]$ couple in an acid solution in which the electrical potential (E) is $-0.36$ volts.

20. The apparatus according to claim 16 wherein the redox couple solution comprises a ferrous/ferric ($Fe^{+2-}$ /Fe$^{+3}$) couple in an acid solution in which the electrical potential (E) is −0.77 volts.

21. The apparatus according to claim 16 wherein the redox couple solution comprises a cerrous/cerric (Ce$^{+3}$/Ce$^{+4}$) couple in an acid solution in which the electrical potential (E) is −1.61 volts.

22. The apparatus according to claim 16 wherein the redox couple solution comprises a hydraquinone/quinone couple (C$_6$H$_4$(OH)$_2$/C$_6$H$_4$O$_2$) couple in an acid solution in which the electrical potential (E) is about −0.7+0.059×pH.

23. The apparatus according to claim 15 further including means for illuminating said major one surface portion with steady red light to suppress space charge effects in said sample.

24. The apparatus according to claim 15 further including plotting means responsive to said first and second signals for automatically plotting a curve of illuminating intensity (I) versus the reciprocal absorption coefficient ($\alpha$) as a function of wavelength ($\lambda$) for a plurality of wavelengths of light.

25. The apparatus according to claim 15 wherein said sample is formed of N-type amorphous silicon semiconductor material and wherein said redox solution has a redox potential of +0.1 to −1.65 volts.

26. The apparatus according to claim 15 wherein said sample is formed of P-type amorphous silicon semiconductor material and wherein said redox solution has a redox potential of +0.6 to +0.1 volts.

27. The apparatus according to claim 15 wherein said electrical signal means includes a high impedance amplifier to reduce the current drawn through said solution.

28. The apparatus according to claim 15 wherein said illuminating means includes a xenon light source.

29. The apparatus according to claim 28 further including variably adjustable attenuator means to attenuate light intensity from said xenon light source.

30. The apparatus according to claim 29 further including servo means responsive to said SPV signal to automatically adjust said attenuator to control the light intensity from said xenon light source to a predetermined value.

31. The apparatus according to claim 15 wherein said drop holding means includes means to move said drop over said material surface from one portion thereof to another.

32. The apparatus according to claim 15 wherein said drop hold means includes means to vary a vertical force on said body.

33. The apparatus according to claim 15 wherein said transparent body is an elongated fiber optic rod having one end coupled to receive light from said illuminating means and wherein said SPV signal means includes a conductive ring around the opposite end of said rod and adapted to mate electrical contact with said drop.

34. The apparatus according to claim 33 wherein said rod has a second end adjacent said one end, said second end adapted to be coupled to a source of red d.c. light whereby red d.c. light and a.c. illuminating light is conducted through said rod to said surface via said drop.

* * * * *